(12) United States Patent
Slodowski

(10) Patent No.: US 7,349,106 B2
(45) Date of Patent: Mar. 25, 2008

(54) APPARATUS AND METHOD FOR THIN-LAYER METROLOGY

(75) Inventor: Matthias Slodowski, Jena (DE)

(73) Assignee: Vistec Semiconductor Systems Jena GmbH, Jena (DE)

( * ) Notice: Subject to any disclaimer, the term of this patent is extended or adjusted under 35 U.S.C. 154(b) by 400 days.

(21) Appl. No.: 10/777,162

(22) Filed: Feb. 13, 2004

(65) Prior Publication Data

US 2004/0164725 A1 Aug. 26, 2004

(30) Foreign Application Priority Data

Feb. 25, 2003 (DE) ................ 103 08 258

(51) Int. Cl.
- G01B 11/28 (2006.01)
- G01B 11/06 (2006.01)
- G01B 11/08 (2006.01)
- G01B 11/04 (2006.01)
- G01B 11/02 (2006.01)
- G01N 21/00 (2006.01)
- G06K 9/00 (2006.01)

(52) U.S. Cl. ............... 356/630; 356/237.4; 356/237.5; 356/634; 356/635; 356/636; 382/145

(58) Field of Classification Search ............... None
See application file for complete search history.

(56) References Cited

U.S. PATENT DOCUMENTS

| | | | | |
|---|---|---|---|---|
| 4,618,938 A * | 10/1986 | Sandland et al. | ........... | 382/148 |
| 4,764,969 A * | 8/1988 | Ohtombe et al. | ........... | 382/148 |
| 4,917,556 A * | 4/1990 | Stark et al. | ........... | 414/217 |
| 6,178,257 B1 * | 1/2001 | Alumot et al. | ........... | 382/145 |
| 6,208,751 B1 * | 3/2001 | Almogy | ........... | 382/149 |
| 6,241,456 B1 * | 6/2001 | Kato et al. | ........... | 414/783 |
| 6,493,082 B2 * | 12/2002 | Nara et al. | ........... | 356/394 |
| 6,919,957 B2 * | 7/2005 | Nikoonahad et al. | ........... | 356/237.2 |
| 7,173,693 B2 * | 2/2007 | Shibata et al. | ........... | 356/237.1 |
| 2002/0051698 A1 * | 5/2002 | Birkner et al. | ........... | 414/217 |
| 2002/0095999 A1 * | 7/2002 | Birkner et al. | ........... | 73/865.8 |
| 2002/0176074 A1 * | 11/2002 | Hasan | ........... | 356/237.5 |
| 2003/0140716 A1 * | 7/2003 | Birkner et al. | ........... | 73/865.8 |
| 2004/0029333 A1 * | 2/2004 | Matsukawa | ........... | 438/200 |
| 2005/0038554 A1 * | 2/2005 | Watkins | ........... | 700/213 |
| 2005/0072945 A1 * | 4/2005 | Fukazawa et al. | ........... | 250/559.45 |

FOREIGN PATENT DOCUMENTS

DE 100 53 232 A1 5/2002

* cited by examiner

Primary Examiner—Gregory J. Toatley, Jr.
Assistant Examiner—Gordon J. Stock, Jr.
(74) Attorney, Agent, or Firm—Foley & Lardner LLP

(57) ABSTRACT

An apparatus (1) and a method for thin-layer metrology of semiconductor substrates (16) are disclosed. The semiconductor substrates (16) are delivered or transported to the apparatus (1) by means of at least one cassette element. A measurement unit (5) for thin-layer micrometrology is provided in the apparatus (1), the semiconductor substrates being conveyed by means of a transport mechanism (7) from the cassette element (3) to the measurement unit (5) for thin-layer micrometrology. A measurement unit (9) for thin-layer macrometrology is provided in the region of the transport mechanism (7) after the cassette element (3). By means of the measurement unit (9) for thin-layer macrometrology, measurement locations (22) on the semiconductor substrate that require more detailed examination in the measurement unit (5) for thin-layer micrometrology can rapidly be identified.

16 Claims, 5 Drawing Sheets

APPARATUS AND METHOD FOR THIN-LAYER METROLOGY

CROSS REFERENCE TO RELATED APPLICATIONS

This application claims priority of the German patent application 103 08 258.1 which is incorporated by reference herein.

FIELD OF THE INVENTION

The invention concerns an apparatus for thin-layer metrology. The invention concerns in particular an apparatus for thin-layer metrology on semiconductor substrates, the apparatus comprising at least one cassette element for semiconductor substrates and a first measurement unit for thin-layer micrometrology. In addition, a transport mechanism is provided between the cassette element for the semiconductor substrates and the measurement unit for thin-layer micrometrology.

The invention furthermore concerns a method for thin-layer metrology.

BACKGROUND OF THE INVENTION

German Patent DE 100 53 232 discloses a substrate delivery module for a workstation. Semiconductor substrates are transferred out of the substrate delivery module to the workstation for further examination. In the workstation, for example, microscopic examinations of the semiconductor substrate are performed. The system made up of the substrate delivery module and workstation is particularly flexible, since the substrate delivery module can be mounted on any side of the workstation. The apparatus described in the patent has the critical disadvantage, however, that only one specific operation—for example, a macroinspection or microinspection—can be performed in the workstation. If more than one examination is to be performed with the workstation, this requires an additional device; this increases the basal area or installation area of the overall apparatus at a semiconductor fabrication site.

In the manufacture of semiconductor wafers, between certain manufacturing steps the substrates are transported in cassettes of various kinds to different workstations, and there must be introduced into the respective workstation. Transport can be accomplished manually or automatically.

Each of the workstations serves different purposes for treatment of the substrates, such as inspection, measurement or processing of the substrates. In terms of inspection of the substrates, a distinction is made between a macroinspection and a microinspection. An inspection is performed in the latter case, in particular, in terms of undesirable particles on the substrates, or defects in the features or on the surface of the substrate. The inspection can be accomplished by the user him- or herself, or automatically using an electronic camera. For example, the undesirable particles or feature defects can be automatically recognized and classified (defect analysis). In addition, the widths or thicknesses of the features can be measured (CD analysis, layer thickness analysis). Because of the small size of the objects being examined on the substrate, microscopes are usually used in such workstations for this inspection and assessment application. Macroinspection is performed in a separate workstation. In macroinspection, macroscopic defects such as scratches, coating defects or dirt particles, or other macroscopic inhomogeneities such as fluctuations in the thickness of thin layers applied to the semiconductor substrate, can be rapidly detected. These defects can thus be passed on to a microinspection step for more thorough inspection.

SUMMARY OF THE INVENTION

It is the object of the invention to create an apparatus for thin-layer metrology that combines both macro- and micrometrology in one apparatus.

This object is achieved by way of an apparatus for thin-layer metrology of semiconductor substrates, comprising: at least one cassette element for the semiconductor substrates, a first measurement unit for thin-layer micrometrology, a transport mechanism being provided between the cassette element for the semiconductor substrates and the measurement unit for thin-layer micrometrology, and a measurement unit for thin-layer macrometrology, wherein the measurement unit for thin-layer macrometrology is positioned in the region of the transport mechanism, after the cassette element and before the measurement unit for thin-layer micrometrology.

A further object of the invention is to create a method for thin-layer metrology that makes possible efficient and reliable processing of semiconductor substrates without thereby increasing the installation area of the overall apparatus.

The aforesaid object is achieved by a method for thin-layer metrology comprising the following steps:
  transferring semiconductor substrates out of at least one cassette element to a measurement unit for thin-layer micrometrology, the semiconductor substrates being guided along past a measurement unit for thin-layer macrometrology;
  determining, at the measurement unit for thin-layer macrometrology, measurement locations on the semiconductor substrates that indicate defects and must be examined more closely;
  transferring the identified measurement locations to a computer; and
  traveling to the identified measurement locations and performing a detailed measurement with the measurement unit for thin-layer micrometrology.

At present, thin layers are assessed using optically based methods, among others. The methods used include spectroscopic photometry (reflectometry), spectroscopic ellipsometry and single- or multiple-wavelength ellipsometry, or a combination of several of the aforementioned methods. The properties of the thin layer are ascertained, in this context, from the properties of a light beam reflected from the sample.

In most of the systems used, the radiation is directed by focusing imaging onto the wafer surface. The measurement spot imaged onto the wafer surface has a size in the region of a few micrometers, e.g. 10 µm. Focusing of the measurement beam into a microscopic region is used so that wafer surfaces patterned into small features can be measured on surfaces of homogeneous material.

The advantage of these systems that measure in microscopically local fashion is that in the small features, a locally defined homogeneous material surface contributes to the measurement signal, and the measurement thus unequivocally reproduces the properties of a locally defined feature.

The disadvantage is that for reasons of measurement time, only a few surfaces on a wafer, and only a few wafers of a wafer cassette or a substrate delivery module, can be measured. Properties of the thin layer deviating from specifications in measurement areas or wafers other than those distributed in random-sample fashion cannot be identified in this fashion. Especially for modern high-technology process control (Advanced Process Control, APC), however, complete monitoring of the process steps by metrology of (if possible) all wafers and of the entire wafer surface is desirable. Microscopic systems furthermore require very complex automation, since the microscopically small measurement fields must be positioned exactly with respect to the focused beam (light beam), e.g. center-related and rotational pre-alignment of the wafer followed by precision alignment via automatic image recognition and coordinate transformation.

In another type of measurement system, the radiation is not focused into a small region but instead generates measurement signals distributed over a larger, macroscopic region. Such systems are also referred to as wafer imaging systems or wafer scanners. The advantage of these systems is that measurement signals are obtained from a substantially larger wafer region in substantially less time. The disadvantage lies in the lower measurement accuracy and the possible occurrence of averaging of the measured properties over different material surfaces.

It is particularly advantageous if the apparatus for thin-layer metrology of semiconductor substrates comprises at least one cassette element for the semiconductor substrates and a first measurement unit for thin-layer micrometrology. A transport mechanism is provided between the cassette element for the semiconductor substrates and the measurement unit for thin-layer micrometrology. In addition, a measurement unit for thin-layer macrometrology is provided in the region of the transport mechanism, after the cassette element and before the measurement unit for thin-layer micrometrology.

The entire apparatus for thin-layer metrology of semiconductor substrates is enclosed by a housing, the housing defining a basal area.

It is extraordinarily advantageous that the measurement unit for thin-layer micrometrology and the measurement unit for thin-layer macrometrology are arranged in the housing of the apparatus in such a way that the basal area is no larger than the basal area of an apparatus for thin-layer metrology that contains only a measurement unit for thin-layer micrometrology.

The measurement unit for thin-layer micrometrology encompasses a microphotometer and/or a microellipsometer.

The measurement unit for thin-layer macrometrology encompasses a macrophotometer.

In the apparatus for thin-layer metrology, the semiconductor substrates are transportable with the feeder for delivery into the measurement unit for thin-layer micrometrology. On the path from the cassette element to the measurement unit for thin-layer micrometrology, the semiconductor substrates are guided along beneath the measurement unit for thin-layer macrometrology, in which context the corresponding measured values are acquired.

The method according to the present invention likewise offers numerous advantages. Firstly the semiconductor substrates are transported out of at least one cassette element to a measurement unit for thin-layer micrometrology. In this context, the semiconductor substrates are guided along past or beneath the measurement unit for thin-layer macrometrology. As the semiconductor substrates are guided along beneath the measurement unit for thin-layer macrometrology, measurement locations on the semiconductor substrates that indicate defects and must be examined more closely are determined. The positions of the identified measurement locations are transferred to a computer. Once the corresponding semiconductor substrate is located in the measurement unit for thin-layer micrometrology, the measurement locations identified by the measurement unit for thin-layer macrometrology are transferred so that the corresponding measurement locations can be inspected in more detail. The more-detailed inspection is accomplished manually by the user with a microscope, or those measurement locations are traveled to automatically so that an automatic microinspection can take place.

BRIEF DESCRIPTION OF THE DRAWINGS

The subject matter of the invention is depicted schematically in the drawings and will be described below with reference to the Figures, in which.

DETAILED DESCRIPTION OF THE INVENTION

Figure 1:
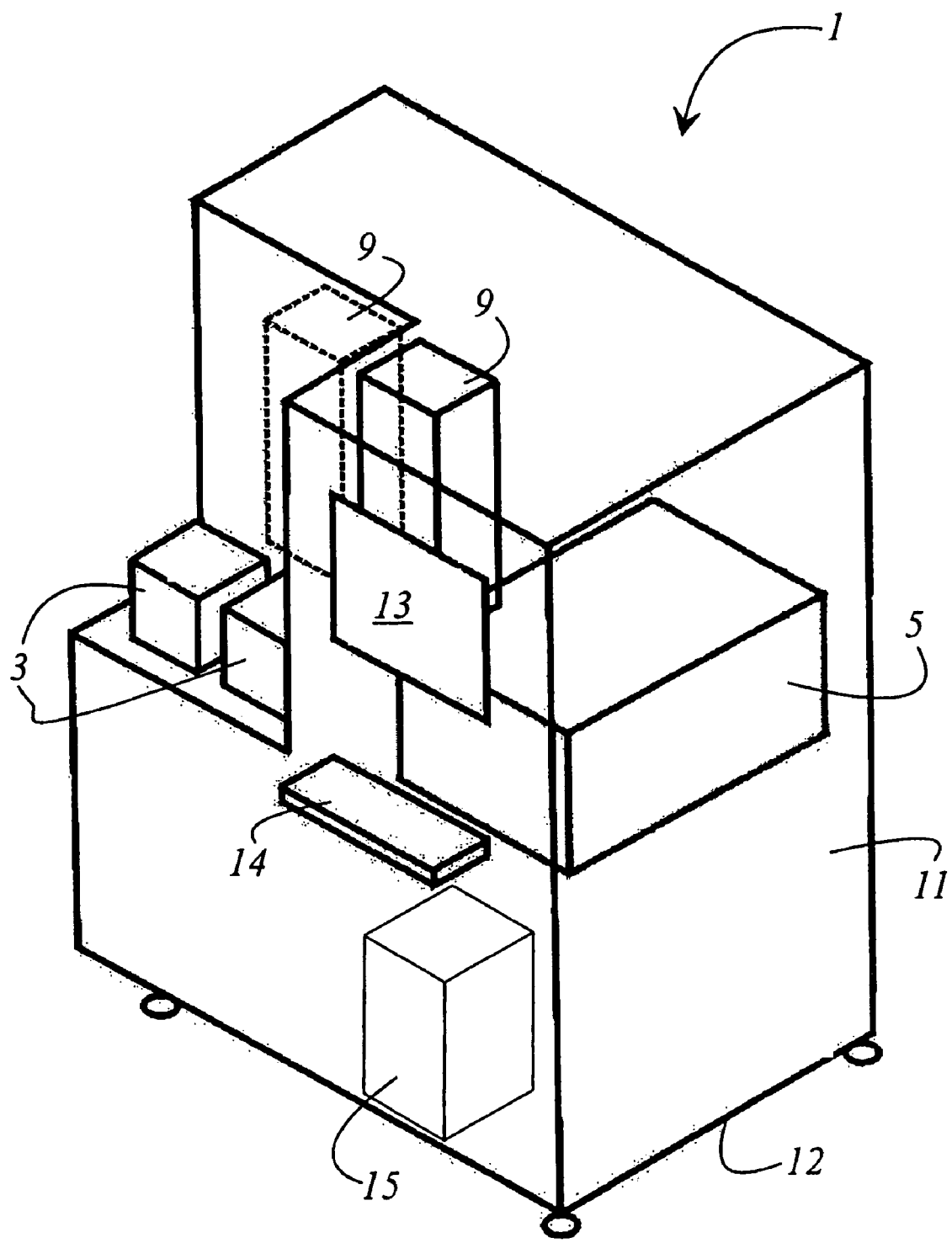
FIG. 1 is a perspective view of the apparatus for thin-layer metrology allowing a view into the interior of the entire apparatus.

FIG. 1 is a schematic perspective view of apparatus 1 for thin-layer metrology that combines in a single measurement device the specific advantages of the method for microscopic examination and the method for macroscopic examination. A higher-quality metrology solution is thus available to the user. The Figure shows the principle of the methodology according to the present invention with reference to a device that is typical for 200-mm wafer metrology. No limitations arise therefrom, however, regarding other device forms or variant arrangements, in particular regarding devices that are used for 300-mm wafer metrology. The parts of the device discussed below are then applicable analogously. Apparatus 1 comprises a housing 11 that defines a basal area 12. At least one cassette element 3 is associated with housing 11 of apparatus 1. Semiconductor substrates are introduced via cassette element 3 into apparatus 1 in order to perform the corresponding measurements or examinations on the semiconductor substrates. Housing 11 of apparatus 1 is equipped with a display 13 by way of which the user receives information and data concerning the various measurement operations. Also provided on housing 11 is an input means 14 with which the user can make appropriate inputs regarding the process sequence and the individual process steps. In the interior, apparatus 1 encompasses a computer 15, a measurement unit 5 for thin-layer micrometrology, and at least one measurement unit 9 for thin-layer macrometrology. Measurement unit 5 for thin-layer micrometrology is arranged substantially in the region of display 13 and keyboard 14. The at least one measurement unit 9 for thin-layer macrometrology is provided substantially in the region between cassette element 3 and measurement unit 5 for thin-layer micrometrology. Measurement unit 9 for thin-layer macrometrology is integrated, together with measurement unit 5 for thin-layer micrometrology, into apparatus 1 in such a way that macroscopic measurements can be performed on the semiconductor substrates in a cassette element 3 while one or more other wafers of the cassette are already being assessed microscopically. The substantially faster and wider-area macroscopic measurement can serve for preselection of those semiconductor substrates that must be subjected to a further microscopic measurement in measurement unit 5 for thin-layer micrometrology. This preselection is possible because for most thin-layer deposition processes, local inhomogeneities are not merely microscopic, but always occur on a scale of centimeters.

Figure 2:
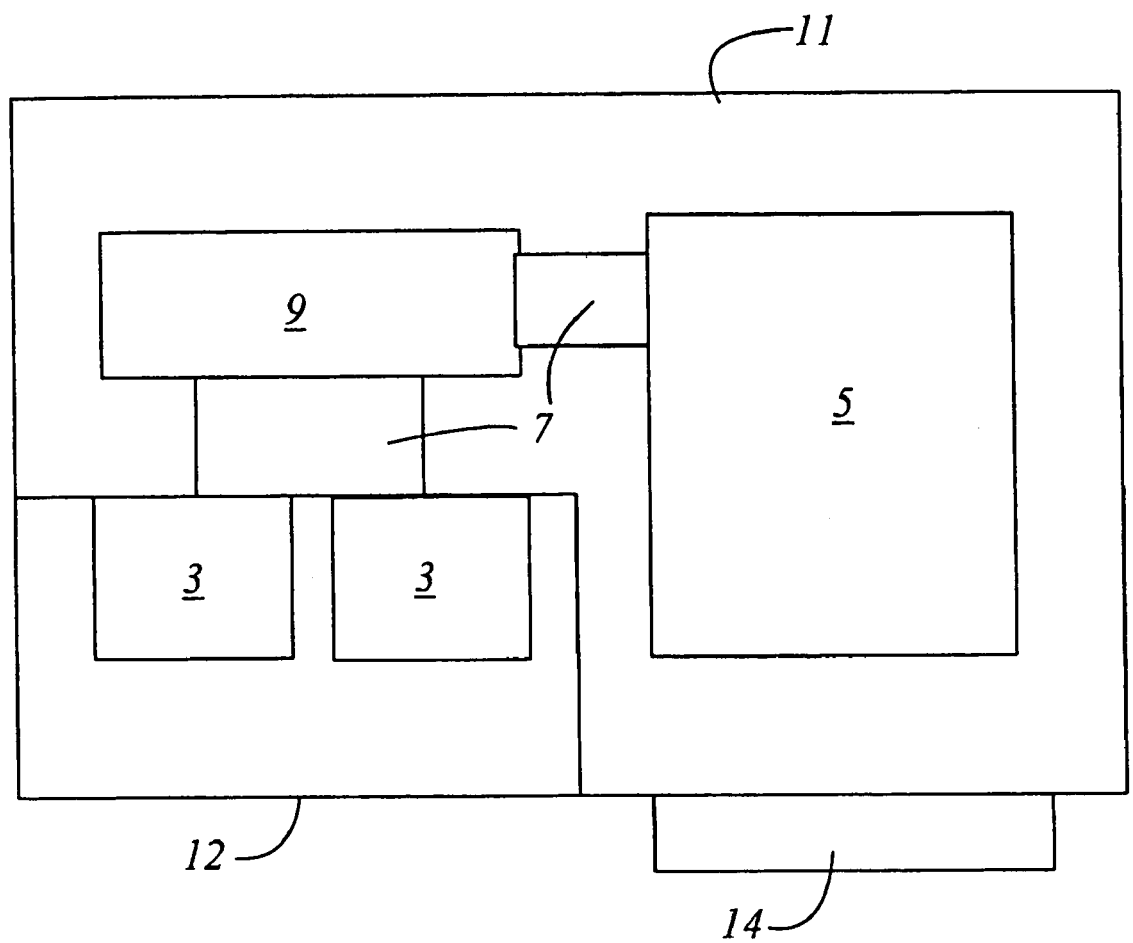
FIG. 2 is a plan view of the apparatus according to the present invention, the essential parts in the interior of the apparatus being depicted schematically.

FIG. 2 is a plan view of apparatus 1 depicting the essential components inside housing 11 of apparatus 1. As already mentioned in the description of FIG. 1, apparatus 1 comprises a housing 11 that defines a basal area 12. At least one cassette element 3 is associated with housing 11. Provided in the interior of apparatus 1 is a transport mechanism 7 that transports or transfers the semiconductor substrates from the at least one cassette element 3 to measurement unit 5 for thin-layer micrometrology. At least one measurement unit 9 for thin-layer macrometrology is provided on the path from cassette element 3 to measurement unit 5 for thin-layer micrometrology. The arrangement of measurement unit 9 for thin-layer macrometrology is such that the semiconductor substrates to be transported are transported past or beneath measurement unit 9 for thin-layer macrometrology. Measurement unit 9 for thin-layer macrometrology is embodied, for example, in the form of a scanner that projects a line of light onto the surface of the semiconductor substrate and correspondingly evaluates the reflected light. The scanned image of the semiconductor substrate contains reflectivity data from the entire surface of the semiconductor substrate. Based on these data, corresponding information can then be obtained indicating measurement locations that must be examined in more detail using a measurement unit 5 for thin-layer micrometrology. The data obtained from measurement unit 9 for thin-layer macrometrology are delivered to the computer provided in apparatus 1, which then uses those data to move automatically to the identified measurement locations in measurement unit 5 for thin-layer micrometrology. With the apparatus according to the present invention it is thus possible to perform both microinspection and macroinspection in one apparatus, with no need to transport the semiconductor substrates externally from one apparatus to another.

Figure 3:
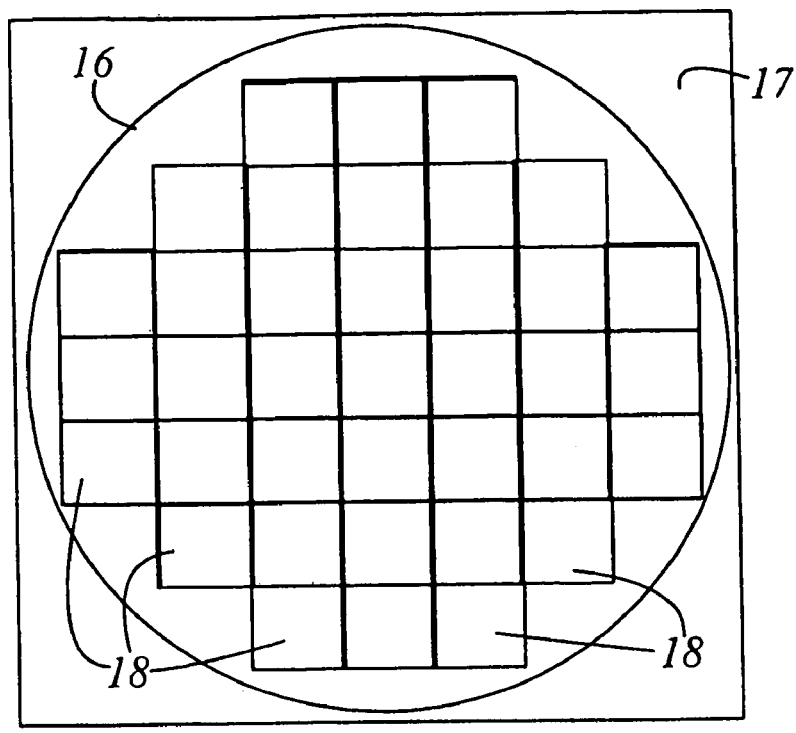
FIG. 3 is a plan view of a semiconductor substrate that is subdivided into the various dice.

FIG. 3 is a schematic view of a semiconductor substrate 16 that is located in a cassette 17. Cassette 17 serves to handle and transport semiconductor substrate 16 in apparatus 1 for thin-layer metrology. Cassettes 17 for semiconductor substrates 16 are stacked independently of one another in cassette element 3, and can be removed individually from transport mechanism 7 provided in apparatus 1 for thin-layer metrology. Dice 18 are correspondingly patterned on semiconductor substrate 16. The objective in apparatus 1 for thin-layer metrology is then to examine the dice patterned on semiconductor substrate 16, and the thin layers applied onto semiconductor substrate 16, in terms of their quality. It is particularly important in this context that a quick overview of semiconductor substrate 16 be obtained, and that a detailed examination of specific measurement points can be performed. The detailed examination of the specific measurement points is limited to a thin-layer micrometrology operation.

Figure 4:
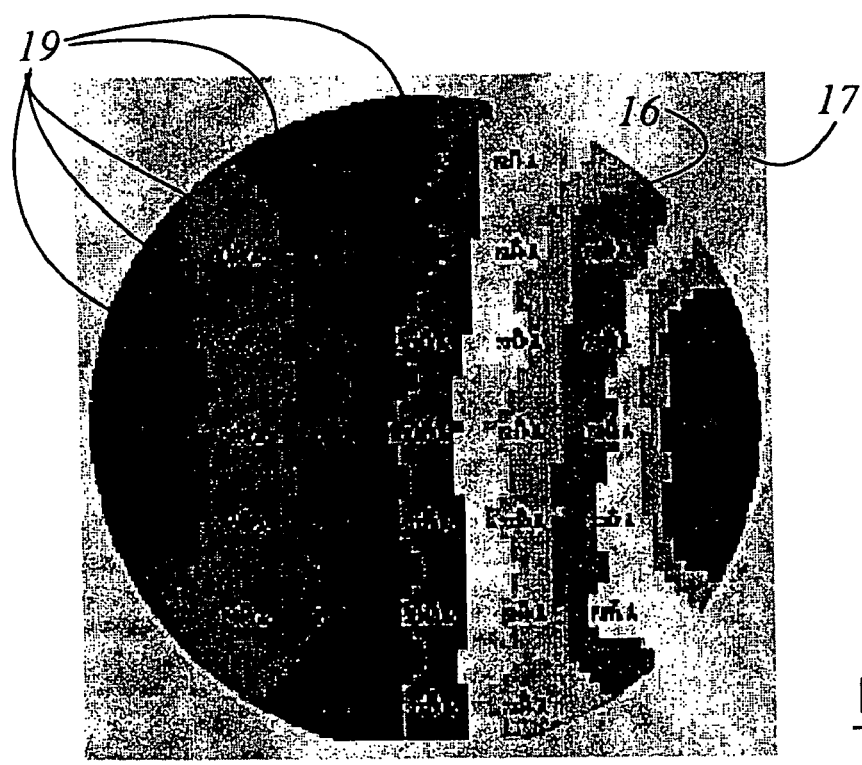
FIG. 4 shows the result of a measurement on the semiconductor substrate using a measurement unit for thin-layer macrometrology.

FIG. 4 is a graphic depiction of a semiconductor substrate 16 in cassette 17, semiconductor 16 having been assessed in measurement unit 9 for thin-layer macrometrology. In measurement unit 9 for thin-layer macrometrology, the thicknesses of transparent films applied onto semiconductor substrate 16 are measured. The measured thicknesses are depicted on display 13 of apparatus 1 in different gray values or different colors. FIG. 4 depicts the various thicknesses of the thin layers applied onto semiconductor substrate 16 in different gray values 19. Apparatus 1 for thin-layer metrology can then be equipped in such a way that the coordinates of those measurement locations on semiconductor substrate 16 that exceed a certain threshold in terms of gray value or color are conveyed to computer 15. Those measurement locations are then traveled to in measurement unit 5 for thin-layer micrometrology and examined in more detail with regard to the possible defects.

Figure 5:
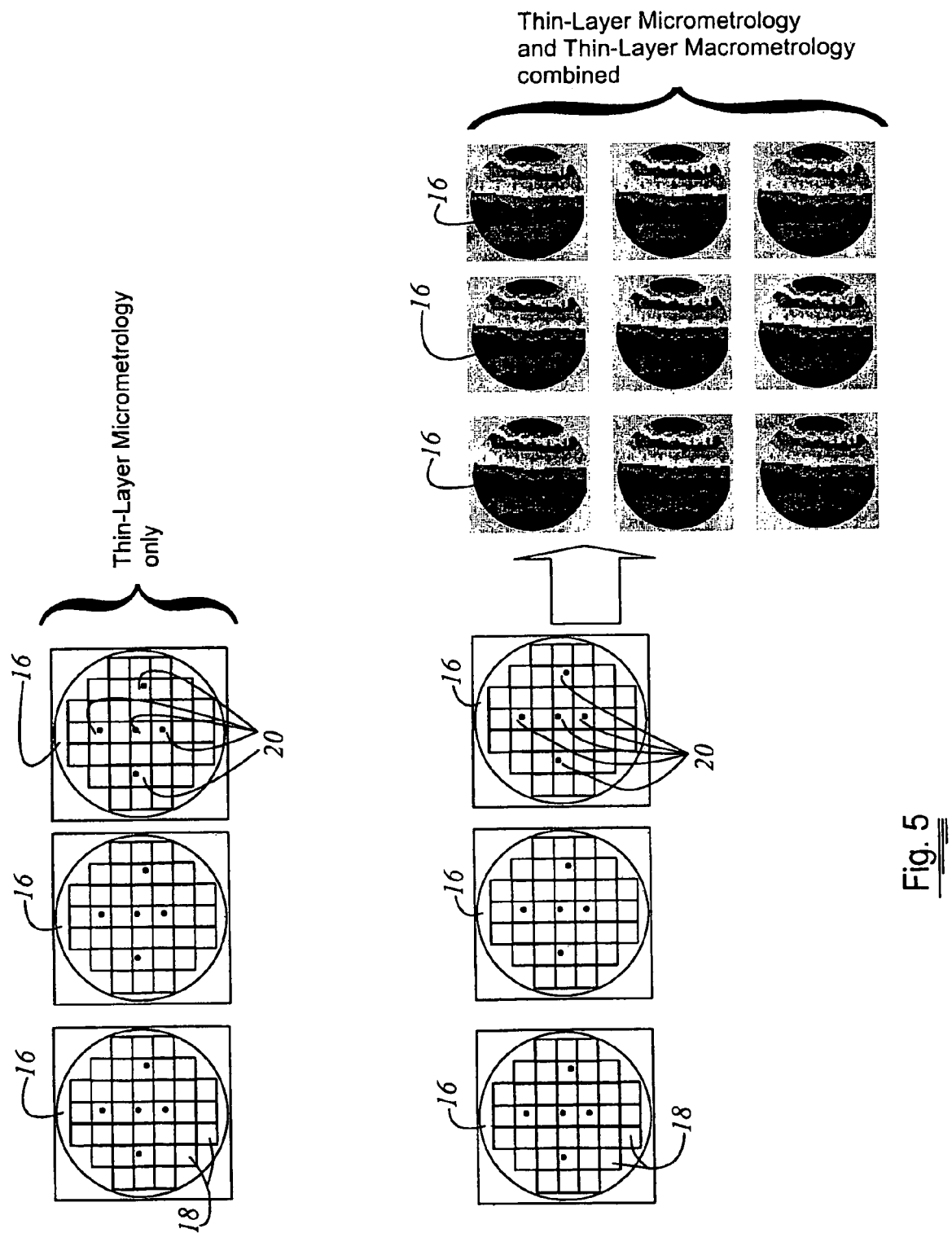
FIG. 5 shows a schematic comparison between a conventional measurement method using the measurement unit for thin-layer micrometrology alone, and the method in which the measurement unit for thin-layer micrometrology is combined in one housing with the measurement unit for thin-layer macrometrology.

FIG. 5 shows, by way of example, a comparison between an apparatus that is suitable only for thin-layer micrometrology and an apparatus 1 for thin-layer metrology that combines both thin-layer micrometrology and thin-layer macrometrology in a single apparatus. The intention here is to examine five points 20 on each semiconductor substrate 16. The five points 20 are distributed each in one of five different dice 18. From the combination depicted in FIG. 5 of a measurement unit 5 for thin-layer micrometrology and measurement unit 9 for thin-layer macrometrology, it is evident that during the measurement in measurement unit 5 for thin-layer micrometrology, semiconductor substrates 16 can be assessed concurrently therewith in measurement unit 9 for thin-layer macrometrology. This is particularly advantageous because the measurement in measurement unit 5 for thin-layer micrometrology can last several minutes, so that a definite time saving can be achieved with the apparatus according to the present invention. If, for example, as depicted in FIG. 5, three semiconductor substrates 16, each having five measurement points 20 to be traveled to, are being assessed in measurement unit 5 for thin-layer micrometrology, then as a result of the apparatus according to the present invention, nine semiconductor substrates 16 can be assessed concurrently therewith in measurement unit 9 for thin-layer macrometrology. Substantially more data are thus obtained for the same throughput of semiconductor substrates 16 in measurement unit 5 for thin-layer micrometrology, since data are being obtained concurrently therewith in measurement unit 9 for thin-layer macrometrology.

Table 1 indicates the number of additional measurements that can be performed in measurement unit 9 for thin-layer macrometrology concurrently with the measurements on semiconductor substrates in measurement unit 5 for thin-layer micrometrology.

TABLE 1

Number of additional measurements in measurement unit 9 for thin-layer macrometrology for a given number of measurement points that need to be traveled to and assessed in measurement unit 5 for thin-layer micrometrology.

| No. of semiconductor substrates on which a micromeasurement is performed | Apparatus with thin-layer macro- and micrometrology | |
| --- | --- | --- |
| | Two points to be assessed on the semiconductor substrate | Five points to be assessed on the semiconductor substrate |
| 0 | 4.5 min for all 25 semiconductor substrates in cassette element | 4.5 min for all 25 semiconductor substrates in cassette element |
| 1 | Two semiconductor substrates can be assessed macroscopically (in a further 4.3 min, all 25 semiconductor substrates in cassette element are assessed) | Three semiconductor substrates can be assessed macroscopically (in a further 4.2 min, all 25 semiconductor substrates in cassette element are assessed) |
| 2 | Four semiconductor substrates can be assessed macroscopically | Six semiconductor substrates can be assessed macroscopically (in a further 3.5 min, all 25 semiconductor substrates in cassette element are assessed) |
| 5 | 10 semiconductor substrates can be assessed macroscopically | 15 semiconductor substrates can be assessed macroscopically (in a further 2.0 min, all 25 semiconductor substrates in cassette element are assessed) |
| 10 | 20 semiconductor substrates can be assessed macroscopically (in a further 1.3 min, all 25 semiconductor substrates in cassette element are assessed) | 25 semiconductor substrates can be assessed macroscopically |
| 25 | 25 semiconductor substrates can be assessed macroscopically | 25 semiconductor substrates can be assessed macroscopically |

Figure 6:
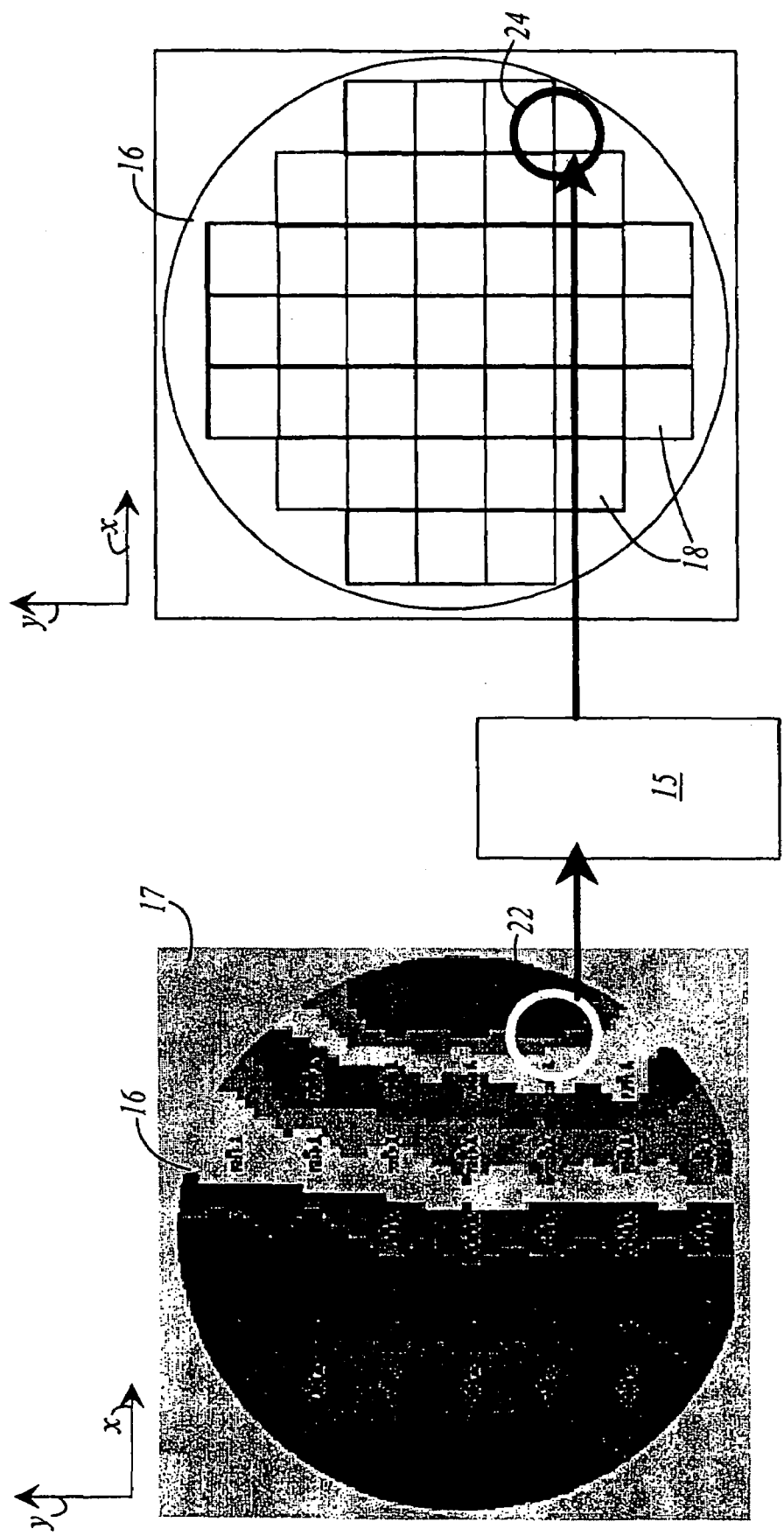
FIG. 6 shows an allocation of a measurement location identified in the measurement unit for thin-layer macrometrology to a corresponding measurement location in the measurement unit for thin-layer micrometrology.

FIG. 6 schematically shows the allocation of a measurement location 22 identified in measurement unit 9 for thin-layer macrometrology to a corresponding measurement location 24 in measurement unit 5 for thin-layer micrometrology. In measurement unit 9 for thin-layer macrometrology, there is found on semiconductor substrate 16 a measurement location 22 at which a certain threshold value is exceeded in terms of thickness fluctuations of the thin layers applied onto semiconductor substrate 16. The corresponding X coordinates and Y coordinates of measurement point 22 are determined and are transferred to computer 15. It is self-evident to one skilled in the art that measurement point 22 can possess a certain extension in terms of area, which is likewise transmitted to computer 15. From computer 15, the corresponding data for measurement point 22 that was identified in measurement unit 9 for thin-layer macrometrology are transferred to measurement unit 5 for thin-layer micrometrology. Semiconductor substrate 16 is appropriately oriented in measurement unit 5 for thin-layer micrometrology so that measurement location 22 identified in measurement unit 9 for thin-layer macrometrology can also be located again. The orientation can be performed, on the one hand, in such a way that semiconductor substrate 16 possesses the same orientation in measurement unit 9 for thin-layer macrometrology and in measurement unit 5 for thin-layer micrometrology. If the orientation of semiconductor substrate 16 in measurement unit 5 for thin-layer micrometrology differs from the orientation of semiconductor substrate 16 in measurement unit 9 for thin-layer macrometrology, measurement location 24 in measurement unit 5 for thin-layer micrometrology can then be located by way of a suitable coordinate transformation. In measurement unit 5 for thin-layer micrometrology, a highly accurate and precise measurement is performed by means of a microphotometer and/or a microellipsometer.

What is claimed is:

1. An apparatus for thin-layer metrology of semiconductor substrates, comprising:
  at least one cassette element for the semiconductor substrates,
  a first measurement unit for thin-layer micrometrology,
  a transport mechanism being provided between the cassette element for the semiconductor substrates and the first measurement unit for thin-layer micrometrology, and
  a measurement unit for thin-layer macrometrology, wherein the measurement unit for thin-layer macrometrology is positioned in a region of the transport mechanism, after the cassette element and before the first measurement unit for thin-layer micrometrology such that the semiconductor substrates are guided from the cassette element beneath the measurement unit for thin-layer macrometrology to the first measurement unit for thin-layer micrometrology, wherein the measurement unit for thin-layer macrometrology projects a line of light onto the semiconductor substrates and acquires an image of an entire surface of each substrate during the guidance of the semiconductor substrates from the cassette element to the first measurement unit for thin-layer micrometrology.

2. The apparatus as defined in claim 1, wherein the measurement unit for thin-layer macrometrology comprises a macrophotometer.

3. The-apparatus as defined in claim 1, wherein the transport mechanism comprises a feeder that transports the semiconductor substrates from the cassette element to the first measurement unit for thin-layer micrometrology.

4. The apparatus as defined in claim 1, wherein in the apparatus for thin-layer metrology, the semiconductor substrates are pullable with a feeder out of the cassette element for delivery into the first measurement unit for thin-layer micrometrology, the semiconductor substrates being guidable beneath the measurement unit for thin-layer macrometrology; and measured values being automatically acquirable.

5. The apparatus as defined in claim 1, wherein the semiconductor substrates are wafers.

6. The apparatus as defined in claim 1, wherein the first measurement unit for thin-layer micrometrology comprises a microphotometer, a microellipsometer, or a combination thereof.

7. The apparatus as defined in claim 1, wherein the apparatus for thin-layer metrology of semiconductor substrates is enclosed by a housing, the housing defining a basal area.

8. The apparatus as defined in claim 7, wherein the first measurement unit for thin-layer micrometrology and the measurement unit for thin-layer macrometrology are arranged within the housing of the apparatus in such a way that the basal area is no larger than the basal area of an apparatus for thin-layer metrology that contains only a measurement unit for thin-layer micrometrology.

9. A method for thin-layer metrology comprising the following steps:
    transferring semiconductor substrates out of at least one cassette element to a measurement unit for thin-layer micrometrology using a transport mechanism provided between the cassette element and the measurement unit for thin-layer micrometrology, the semiconductor substrates being guided beneath a measurement unit for thin-layer macrometrology during transport to the measurement unit for thin-layer micrometrology;
    projecting a line of light from the measurement unit for thin-layer macrometrology onto the semiconductor substrates;
    acquiring an image of an entire surface of each semiconductor substrate in the measurement unit for thin-layer macrometrology during the guidance of the semiconductor substrates from the cassette element to the measurement unit for thin-layer micrometrology;
    determining from the acquired image one or more measurement locations on the semiconductor substrates that indicate one or more defects that must be examined more closely;
    transferring data of the one or more identified measurement locations to a computer; and
    adjusting the measurement unit for thin-layer micrometrology to the one or more identified measurement locations and performing a detailed measurement of the one or more defects with the measurement unit for thin-layer micrometrology.

10. The method as defined in claim 9 wherein the one or more measurement locations identified in the determination step are used as a preselection of the semiconductor substrates to be measured with the measurement unit for thin-layer micrometrology, the one or more measurement locations for the measurement unit for thin-layer micrometrology being transferred automatically.

11. The method as defined in claim 9 wherein further semiconductor substrates are delivered to the measurement unit for thin-layer macrometrology while a semiconductor substrate is being assessed microscopically in the measurement unit for thin-layer micrometrology.

12. The method as defined in claim 9 wherein the determination of the one or more measurement locations on the semiconductor substrates by the measurement unit for thin-layer macrometrology supplies measured values that are used, by way of an evaluation of defined monitoring thresholds, for a decision as to whether and at which microscopic points on the semiconductor substrate measurements are to be performed with the measurement unit for thin-layer micrometrology.

13. The method as defined in claim 9 wherein the measurement unit for thin-layer macrometrology comprises a macrophotometer.

14. The method as defined in claim 9 wherein the transport mechanism comprises a feeder.

15. The method as defined in claim 9 wherein the one or more measurement locations determined in the measurement unit for thin-layer macrometrology and the corresponding one or more measurement locations in the measurement unit for thin-layer micrometrology are related by coordinate transformation.

16. The method as defined in claim 9 wherein the measurement unit for thin-layer micrometrology comprises a microphotometer, a microellipsometer, or a combination thereof.

* * * * *